United States Patent
Kim et al.

(10) Patent No.: US 10,985,036 B2
(45) Date of Patent: Apr. 20, 2021

(54) SUBSTRATE PROCESSING APPARATUS AND APPARATUS FOR MANUFACTURING INTEGRATED CIRCUIT DEVICE

(71) Applicant: Samsung Electronics Co., Ltd., Suwon-si (KR)

(72) Inventors: Young-Hoo Kim, Yongin-si (KR); Sang-Jine Park, Suwon-si (KR); Yong-Jhin Cho, Hwaseong-si (KR); Yeon-Jin Gil, Daegu (KR); Ji-Hoon Jeong, Suwon-si (KR); Byung-Kwon Cho, Suwon-si (KR); Yong-Sun Ko, Suwon-si (KR); Kun-Tack Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 331 days.

(21) Appl. No.: 15/827,144

(22) Filed: Nov. 30, 2017

(65) Prior Publication Data
US 2018/0358242 A1 Dec. 13, 2018

(30) Foreign Application Priority Data
Jun. 8, 2017 (KR) .................. 10-2017-0071729

(51) Int. Cl.
H01L 21/67 (2006.01)
H01L 21/687 (2006.01)
H01L 21/02 (2006.01)

(52) U.S. Cl.
CPC .... *H01L 21/67034* (2013.01); *H01L 21/6719* (2013.01); *H01L 21/67126* (2013.01); *H01L 21/68735* (2013.01); *H01L 21/02101* (2013.01)

(58) Field of Classification Search
CPC ............ B01D 11/0203; B01D 11/0403; B01D 11/0407; B01D 11/0411; B01J 3/008; B01J 3/06; B08B 7/0021; C30B 7/10; Y02P 20/544; Y10S 134/902; C23C 16/0227; C23C 16/45587; C23C 16/45589; C23C 16/45591; C23C 16/4582; C23C 16/4585; C23C 16/4587; H01J 2237/335; H01J 37/32623; H01J 37/32633; H01J 37/32642; H01J 37/32652; H01J 37/32816;
(Continued)

(56) References Cited

U.S. PATENT DOCUMENTS 5,417,768 A * 5/1995 Smith, Jr. .......... B01D 11/0203
134/10
5,509,431 A * 4/1996 Smith, Jr. .......... B01D 11/0203
134/103.1
(Continued)

FOREIGN PATENT DOCUMENTS

JP 2001-077074 3/2001
JP 4358486 11/2009
(Continued)

*Primary Examiner* — Jeffrie R Lund
*Assistant Examiner* — Stanislav Antolin
(74) *Attorney, Agent, or Firm* — Muir Patent Law, PLLC

(57) ABSTRACT

A substrate processing apparatus includes a vessel providing a processing space for processing a substrate, a substrate support supporting the substrate loaded in the processing space, and a barrier between a side wall of the vessel and the substrate support and surrounding an edge of the substrate supported by the substrate support.

17 Claims, 14 Drawing Sheets

US 10,985,036 B2
Page 2

(58) Field of Classification Search
CPC ......... H01J 37/32825; H01L 21/02057; H01L 21/02101; H01L 21/02334; H01L 21/32134; H01L 21/67017; H01L 21/67028; H01L 21/67034; H01L 21/67126; H01L 21/6719; H01L 21/68735; H01L 21/68742; H01L 21/6875; H01L 21/68771; H01L 21/68785
See application file for complete search history.

(56) References Cited

U.S. PATENT DOCUMENTS

| | | | |
|---|---|---|---|
| 5,591,415 A * | 1/1997 | Dassel | B01J 3/00 422/241 |
| 5,881,577 A * | 3/1999 | Sauer | D06F 43/00 239/136 |
| 6,165,282 A * | 12/2000 | Marshall | B08B 7/0021 134/10 |
| 6,328,560 B1 * | 12/2001 | Fujikawa | C23C 14/046 432/205 |
| 6,334,266 B1 * | 1/2002 | Moritz | B01J 3/008 118/725 |
| 6,712,081 B1 | 3/2004 | Uehara et al. | |
| 6,722,642 B1 * | 4/2004 | Sutton | B25B 11/005 269/21 |
| 9,157,167 B1 * | 10/2015 | Pakalapati | F26B 5/04 34/201 |
| 9,524,864 B2 * | 12/2016 | Oh | H01L 21/67017 |
| 9,534,839 B2 * | 1/2017 | Lee | F26B 5/04 |
| 9,941,110 B2 * | 4/2018 | Oh | H01L 21/67017 |
| 10,083,829 B2 * | 9/2018 | Jeong | H01L 21/02101 |
| 10,155,903 B2 * | 12/2018 | Lee | H01L 21/76802 |
| 10,361,100 B2 * | 7/2019 | Lee | H01L 21/02041 |
| 10,406,567 B2 * | 9/2019 | Hong | H01L 21/02101 |
| 2002/0014257 A1 * | 2/2002 | Chandra | B01J 3/008 134/19 |
| 2002/0046707 A1 * | 4/2002 | Biberger | H01L 21/67051 118/733 |
| 2002/0062848 A1 * | 5/2002 | Luscher | B08B 3/04 134/33 |
| 2002/0070169 A1 * | 6/2002 | Berger | B01D 15/40 210/656 |
| 2002/0070170 A1 * | 6/2002 | Berger | B01D 11/0203 210/656 |
| 2002/0129901 A1 * | 9/2002 | Fujikawa | C30B 33/005 156/345.31 |
| 2002/0133886 A1 * | 9/2002 | Severns | B01J 20/28033 8/142 |
| 2002/0179114 A1 * | 12/2002 | Sakashita | B08B 7/0021 134/3 |
| 2002/0189543 A1 * | 12/2002 | Biberger | H01L 21/6715 118/715 |
| 2003/0047195 A1 * | 3/2003 | deYoung | B08B 7/0021 134/12 |
| 2003/0047551 A1 * | 3/2003 | Worm | B08B 7/0021 219/390 |
| 2003/0056813 A1 * | 3/2003 | Marshall | B08B 7/0021 134/104.4 |
| 2003/0177659 A1 * | 9/2003 | Saito | H01L 21/67034 34/330 |
| 2003/0205510 A1 * | 11/2003 | Jackson | B01D 17/0205 210/86 |
| 2003/0232512 A1 * | 12/2003 | Dickinson | B08B 3/04 438/786 |
| 2004/0003831 A1 * | 1/2004 | Mount | B01J 3/008 134/26 |
| 2004/0031441 A1 | 2/2004 | Muraoka et al. | |
| 2004/0123484 A1 * | 7/2004 | Yoshikawa | B08B 7/0021 34/410 |
| 2004/0157463 A1 * | 8/2004 | Jones | H01L 21/67126 438/716 |
| 2004/0187792 A1 * | 9/2004 | Parks | G03F 7/2014 118/733 |
| 2004/0187894 A1 * | 9/2004 | Parks | H01L 21/6875 134/21 |
| 2004/0211447 A1 * | 10/2004 | Yokomizo | B08B 7/0021 134/31 |
| 2004/0255979 A1 * | 12/2004 | Fury | H01L 21/67017 134/21 |
| 2005/0005957 A1 * | 1/2005 | Yamagata | B08B 7/0021 134/200 |
| 2005/0014370 A1 * | 1/2005 | Jones | H01L 21/67126 438/689 |
| 2005/0183739 A1 * | 8/2005 | McDermott | B06B 3/00 134/1 |
| 2005/0205515 A1 * | 9/2005 | Saga | B81C 1/00849 216/2 |
| 2006/0102287 A1 * | 5/2006 | Grant | H01L 21/67103 156/345.51 |
| 2006/0141809 A1 * | 6/2006 | Rye | H01L 21/6838 438/800 |
| 2006/0153757 A1 * | 7/2006 | Cooper | B01J 3/02 422/243 |
| 2006/0278254 A1 * | 12/2006 | Jackson | B08B 7/0021 134/21 |
| 2007/0012339 A1 * | 1/2007 | Fukuda | H01L 21/67051 134/26 |
| 2007/0022949 A1 * | 2/2007 | Saito | B08B 3/02 118/52 |
| 2007/0119477 A1 * | 5/2007 | Redecker | B08B 3/12 134/1.3 |
| 2007/0144555 A1 * | 6/2007 | Chen | B08B 7/0021 134/1 |
| 2007/0169791 A1 * | 7/2007 | Han | B08B 3/00 134/2 |
| 2007/0169794 A1 * | 7/2007 | Han | H01L 21/02071 134/94.1 |
| 2007/0293054 A1 * | 12/2007 | Lee | H01L 21/02101 438/743 |
| 2008/0029159 A1 * | 2/2008 | Lee | H01L 21/67028 137/154 |
| 2008/0063493 A1 * | 3/2008 | Cho | H01L 21/67034 414/217 |
| 2008/0223415 A1 * | 9/2008 | Parks | B08B 7/0021 134/34 |
| 2009/0020068 A1 * | 1/2009 | Ode | B08B 7/0021 117/12 |
| 2009/0107522 A1 * | 4/2009 | Uchida | H01L 21/67051 134/3 |
| 2009/0117740 A1 * | 5/2009 | Shih | C25D 5/08 438/692 |
| 2009/0200161 A1 * | 8/2009 | Shih | C25D 5/08 204/242 |
| 2010/0031873 A1 * | 2/2010 | D'Evelyn | B01J 3/008 117/68 |
| 2010/0031876 A1 * | 2/2010 | D'Evelyn | B01J 3/008 117/71 |
| 2010/0147210 A1 * | 6/2010 | d'Evelyn | C30B 29/403 117/81 |
| 2011/0000507 A1 * | 1/2011 | Toshima | H01L 21/02057 134/19 |
| 2011/0200742 A1 * | 8/2011 | Ikeda | F26B 5/042 427/101 |
| 2011/0214694 A1 * | 9/2011 | Toshima | B08B 5/00 134/21 |
| 2011/0232504 A1 * | 9/2011 | Fiori | A47J 39/003 99/467 |
| 2011/0247662 A1 * | 10/2011 | Kamikawa | H01L 21/67034 134/105 |
| 2012/0073599 A1 * | 3/2012 | Miya | H01L 21/67028 134/4 |
| 2012/0152898 A1 * | 6/2012 | Cho | B08B 7/0021 216/59 |
| 2012/0266925 A1 * | 10/2012 | Nakashima | H01L 21/67126 134/200 |
| 2012/0325145 A1 | 12/2012 | Satoyoshi et al. | |
| 2013/0025155 A1 * | 1/2013 | Kim | H01L 21/67028 34/516 |

(56) References Cited

U.S. PATENT DOCUMENTS

| | | | | |
|---|---|---|---|---|
| 2013/0105378 A1* | 5/2013 | Wang | | H01L 21/6715 118/715 |
| 2013/0145640 A1* | 6/2013 | Lee | | F26B 5/04 34/201 |
| 2013/0199051 A1* | 8/2013 | Oh | | H01L 21/67017 34/79 |
| 2013/0318812 A1* | 12/2013 | Kim | | F26B 21/12 34/282 |
| 2014/0262024 A1* | 9/2014 | Cho | | H01L 21/67051 156/345.1 |
| 2014/0291421 A1* | 10/2014 | Kim | | H01L 21/67017 239/565 |
| 2015/0176897 A1* | 6/2015 | Jun | | F26B 25/008 34/218 |
| 2015/0303036 A1* | 10/2015 | Jeong | | H01J 37/32513 156/345.1 |
| 2015/0368557 A1* | 12/2015 | Lee | | H01L 21/76802 252/79.1 |
| 2016/0059277 A1* | 3/2016 | Hong | | B08B 7/0021 134/56 R |
| 2016/0121374 A1* | 5/2016 | Lee | | F26B 25/008 34/218 |
| 2016/0133454 A1* | 5/2016 | Lee | | B08B 7/0021 438/769 |
| 2016/0230280 A1* | 8/2016 | Matsui | | C23C 16/4412 |
| 2017/0008040 A1* | 1/2017 | Jeong | | H01L 21/02041 |
| 2017/0098542 A1* | 4/2017 | Gouk | | H01L 21/6719 |
| 2017/0148624 A1* | 5/2017 | Verhaverbeke | ... | H01L 21/67173 |
| 2018/0028936 A1* | 2/2018 | Oh | | B01D 11/0407 |
| 2018/0130675 A1* | 5/2018 | Goshi | | H01L 21/02101 |
| 2018/0190485 A1* | 7/2018 | Jang | | H01L 21/02101 |
| 2018/0358242 A1* | 12/2018 | Kim | | B08B 7/0021 134/12 |
| 2018/0366349 A1* | 12/2018 | Cho | | H01L 21/67126 |
| 2019/0096712 A1* | 3/2019 | Park | | C23C 16/4412 |

FOREIGN PATENT DOCUMENTS

| | | | | |
|---|---|---|---|---|
| JP | 2018074103 A | * | 5/2018 | ....... H01L 21/02041 |
| KR | 10-2016-0019142 A | | 3/2001 | |
| KR | 10-2006-0114574 A | | 11/2006 | |
| KR | 10-2009-0037200 A | | 4/2009 | |
| KR | 10-2012-0133523 A | | 12/2012 | |
| KR | 10-2015-0065461 A | | 6/2015 | |
| KR | 20150065461 A | * | 6/2015 | ........... H01L 21/205 |
| KR | 20160019142 A | * | 2/2016 | ............. H01L 21/02 |
| KR | 20170006570 A | * | 1/2017 | ....... H01L 21/02041 |

\* cited by examiner

SUBSTRATE PROCESSING APPARATUS AND APPARATUS FOR MANUFACTURING INTEGRATED CIRCUIT DEVICE

CROSS-REFERENCE TO RELATED APPLICATION

This application claims the benefit of Korean Patent Application No. 10-2017-0071729, filed on Jun. 8, 2017, in the Korean Intellectual Property Office, the disclosure of which is incorporated herein in its entirety by reference.

BACKGROUND

The inventive concept relates to an integrated circuit device and a method of manufacturing the integrated circuit device, and more particularly to a substrate processing apparatus and an apparatus for manufacturing an integrated circuit device, which use a supercritical fluid.

As design rules of integrated circuit devices decrease, critical dimensions of semiconductor devices are reduced to about 20 nm to about 30 nm or less, and accordingly, a deep and narrow pattern formation process having a relatively high aspect ratio of about 5 or more and a cleaning and drying process accompanied therewith may be used. Methods using a supercritical fluid have been proposed to perform a predetermined process such as etching, cleaning, or drying on a substrate in which a structure having a high aspect ratio is formed in order to manufacture a highly integrated circuit device. However, in conventional substrate processing apparatuses and methods using the supercritical fluid, contaminants such as particles may be generated and remain in vessels of the substrate processing apparatuses using the supercritical fluid, and the contaminants may be adsorbed on substrates again and cause defects on the substrates.

SUMMARY

The inventive concept provides a substrate processing apparatus capable of preventing defects from being generated in a substrate due to particles in a vessel during a drying process for the substrate and an apparatus for manufacturing an integrated circuit device, which includes the substrate processing apparatus.

The inventive concept provides a substrate processing apparatus capable of improving the productivity of a substrate drying process, and an apparatus for manufacturing an integrated circuit device, which includes the substrate processing apparatus.

According to an aspect of the inventive concept, provided is a substrate processing apparatus including: a vessel including a processing space for processing a substrate; a substrate support configured to support the substrate loaded in the processing space; and a barrier, between a side wall of the vessel and the substrate support, configured to surround the substrate support.

According to another aspect of the inventive concept, provided is a substrate processing apparatus including: at least one vessel including a processing space configured to process a substrate, the at least one vessel including an upper vessel and a lower vessel moveably coupled to each other so as to be openable and closable to switch between a closed position for sealing the processing space and an open position for opening the processing space; a substrate support configured to support the substrate loaded in the processing space, wherein the substrate support is coupled to an upper wall defining the processing space of the at least one vessel; a barrier between a side wall of the at least one vessel and the substrate support, wherein the barrier is coupled to the upper wall defining the processing space of the at least one vessel; and an exhaust port in a bottom wall of the at least one vessel opposite the upper wall and configured to discharge a fluid from inside the at least one vessel, wherein the barrier extends downward along a direction of the side wall of the at least one vessel toward the bottom wall, and wherein a lowest portion of the barrier extends past a lowest portion of the substrate support from the upper wall when the vessel is in the closed position.

According to another aspect of the inventive concept, provided is a substrate processing apparatus including: a vessel including a processing space configured to process a substrate, wherein the vessel includes an upper vessel and a lower vessel coupled to each other so as to be openable and closable to switch between a closed position to seal the processing space and an open position to open the processing space; and a first protective layer on a contact portion where the upper vessel and the lower vessel are in contact each other in the closed position and are separated from each other in the open position.

According to another aspect of the inventive concept, provided is an apparatus for manufacturing an integrated circuit device, wherein the apparatus includes: a cleaning unit configured to clean a substrate; and a drying unit including a drying chamber for drying the cleaned substrate, wherein the drying chamber includes: a vessel including a processing space configured to process the cleaned substrate, wherein the vessel includes an upper vessel and a lower vessel coupled to each other so as to be openable and closable to switch between a closed position to seal the processing space and an open position to open the processing space; a substrate support configured to support the substrate loaded in the processing space, wherein the substrate support is coupled to the upper vessel; a barrier coupled to the upper vessel to surround an edge of the substrate supported by the substrate support; and a driving device configured to move at least one of the upper vessel and the lower vessel to the closed position or the open position.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to accompanying drawings.

Figure 1A:
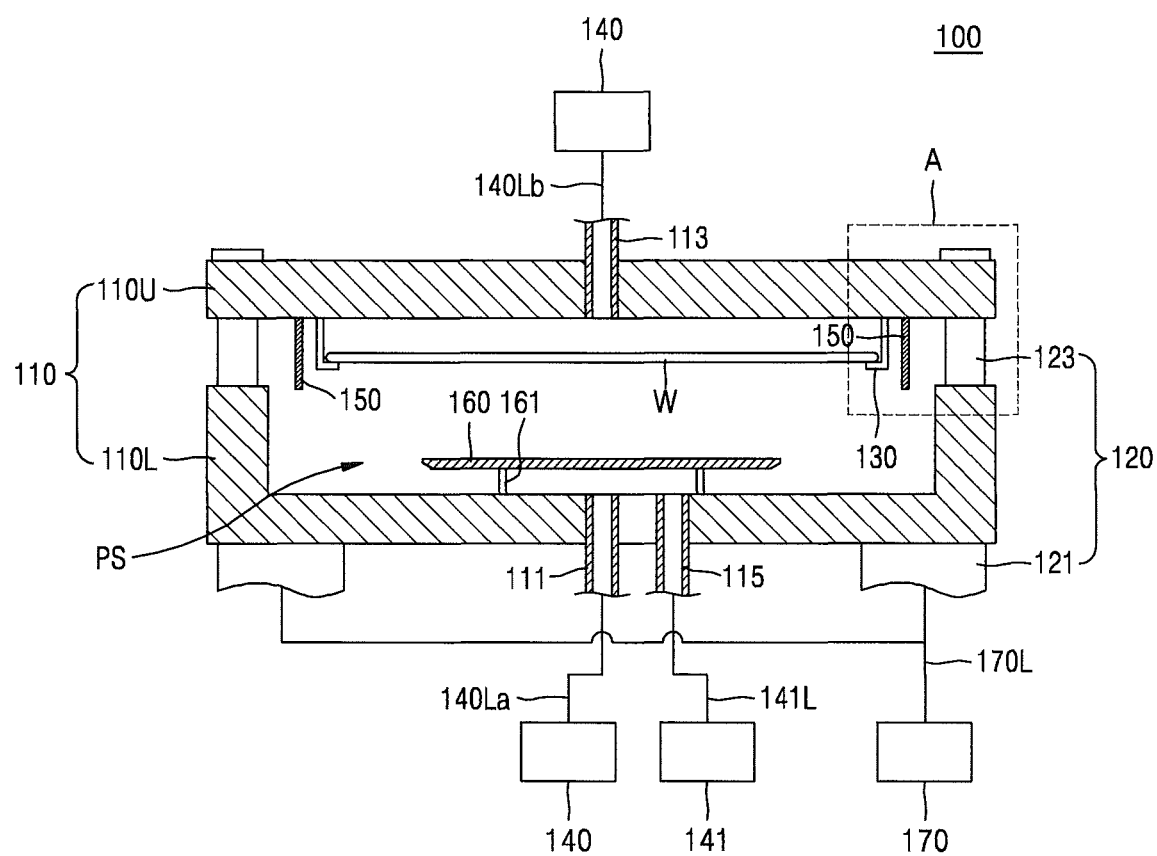
FIGS. 1A and 1B are cross-sectional views schematically showing a substrate processing apparatus according to embodiments.
Figure 1B:
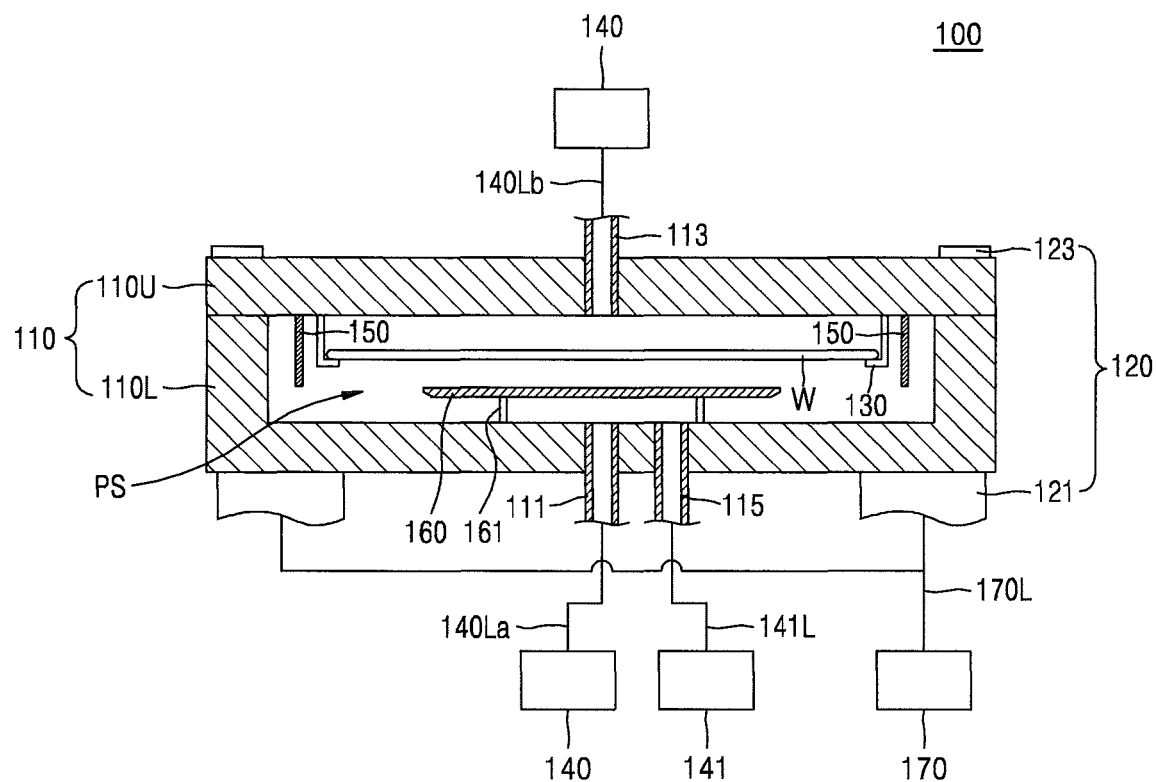

FIGS. 1A and 1B are cross-sectional views schematically showing a substrate processing apparatus 100 according to embodiments. The substrate processing apparatus 100 illustrated in FIG. 1A corresponds to a case where a vessel 110 providing a processing space PS for processing a substrate W is in an open position for opening the processing space PS to the atmosphere, and the substrate processing apparatus 100 illustrated in FIG. 1B may corresponds to a case where the vessel 110 providing the processing space PS for processing the substrate W is in a closed position for sealing the processing space PS.

Referring to FIGS. 1A and 1B, the substrate processing apparatus 100 may include the vessel 110, a substrate support 130, a fluid supply unit 140, an exhaust unit 141, a barrier 150, a blocking plate 160, and a driving device 170.

The vessel 110 may provide the processing space PS for processing the substrate W. For example, in the processing space PS, a drying process for the substrate W, which uses a supercritical fluid, may be performed. The vessel 110 may include a material capable of withstanding a high pressure equal to or greater than a critical pressure.

The supercritical fluid has physical properties such as density, viscosity, diffusion coefficient and polarity, which continuously vary from a gas-like state to a liquid-like state depending on a change in pressure. For example, when liquid carbon dioxide is placed in a sealed container and heated, the interface between gas and liquid may disappear with temperature and pressure exceeding a critical point. The supercritical fluid has high solubility, a high diffusion coefficient, low viscosity, and low surface tension. The supercritical fluid is similar to gas in terms of diffusivity, and thus may infiltrate into a fine groove because the supercritical fluid has no surface tension. In addition, the solubility of the supercritical fluid increases in proportion to pressure and the supercritical fluid is similar to liquid solvent in terms of solubility. Thus, when the supercritical fluid is used, a cleaning liquid or a rinsing liquid on the substrate W may be dried without passing through the interface between gas and liquid, thereby suppressing a leaning phenomenon or water spot generation on the substrate W.

In some embodiments, the supercritical fluid may include carbon dioxide. The carbon dioxide has a low critical temperature of about 31° C. and a low critical pressure of about 73 atm and is non-toxic, non-flammable, and relatively inexpensive, so that the carbon dioxide may be easily used for the drying treatment of the substrate W.

The vessel 110 may include an upper vessel 110U, a lower vessel 110L, a lift member 120, a first supply port 111, a second supply port 113, and an exhaust port 115.

The upper vessel 110U and the lower vessel 110L may be coupled to each other to be openable and closable to switch between a closed position for sealing the processing space PS and an open position for opening the processing space PS to the atmosphere. In some embodiments, the lower vessel 110L forms a space having an opened upper portion, and the upper vessel 110U may be coupled to the lower vessel 110L to cover the space of the lower vessel 110L. In this case, the upper vessel 110U may generally form an upper wall of the vessel 110, and the lower vessel 110L may generally form a bottom wall and a side wall of the vessel 110. However, in other embodiments, the upper vessel 110U may generally form an upper wall and a side wall of the vessel 110, and the lower vessel 110L may generally form a bottom wall of the vessel 110. Alternatively, the upper vessel 110U and the lower vessel 110L may form a side wall of the vessel 110 together.

The switching between the closed position and the open position of the vessel 110 may be performed by the lift member 120 and the driving device 170, which will be described later. In some embodiments, while the vessel 110 is switched between the closed position and the open position, the upper vessel 110U may be fixed and the lower vessel 110L may be lifted with respect to the fixed upper vessel 110U since the lower vessel 110L is positioned under the upper vessel 110U.

For example, as shown in FIG. 1A, when the lower vessel 110L descends and is separated from the upper vessel 110U, the processing space PS is opened to the atmosphere. When the processing space PS is opened, the substrate W may be carried from the outside into the processing space PS or from the processing space PS to the outside of the vessel 110. The substrate W carried into the processing space PS may be in a state where an organic solvent remains through a cleaning process. In the open position of the vessel 110, the upper vessel 110U and the lower vessel 110L may face each other at a predetermined distance from each other. For example, the predetermined distance may be about 5 mm to about 20 mm, but is not limited thereto.

As shown in FIG. 1B, when the lower vessel 110L ascends and comes into close contact with the upper vessel 110U, the processing space PS may be sealed. When the processing space PS is sealed, a drying process for the substrate W, which uses the supercritical fluid, may be performed.

The lift member 120 may lift at least one of the upper vessel 110U and the lower vessel 110L. In other words, at least one of the upper vessel 110U and the lower vessel 110L may be lifted by the lift member 120 to be switched between the closed position and the open position. The lift member 120 may include a lifting cylinder 121 and a lifting rod 123. The lifting cylinder 121 may be coupled to the lower vessel 110L. In order to withstand a high pressure inside the processing space (PS) while a drying process for the substrate W is performed, the lifting cylinder 121 may closely contact the upper vessel 110U and the lower vessel 110L to seal the vessel 110.

The lifting rod 123 may be coupled to the upper vessel 110U and the lower vessel 110L, and vertically move or guide the upper vessel 110U and/or the lower vessel 110L of the vessel 110 between open and closed positions. For example, in some embodiments, one end of the lifting rod 123 may be coupled to the lifting cylinder 121, and the other end may be coupled to the upper vessel 110U. When a driving force is generated by the lifting cylinder 121, the lifting cylinder 121 and the lifting rod 123 and the lower vessel 110L, coupled to the lifting cylinder 121, may be lifted. The lifting rod 123 may guide the upper vessel 110U and/or the lower vessel 110L in a vertical direction while the lower vessel 110L is lifted by the lifting member 120, and may allow the upper vessel 110U and/or the lower vessel 110L to remain horizontal.

The first supply port 111 is used to supply a supercritical fluid into the vessel 110, and may be formed in the lower vessel 110L. For example, the first supply port 111 may be positioned below the center of the substrate W placed on the substrate support 130. The first supply port 111 may be connected to the fluid supply unit 140 through a first supply line 140La.

The second supply port 113 is used to supply a supercritical fluid into the vessel 110, and may be formed in the upper vessel 110U. For example, the second supply port 113 may be positioned above the center of the substrate W placed on the substrate support 130. The second supply port 113 may be connected to the fluid supply unit 140 through a second supply line 140Lb. In some embodiments, fluid for pressure control may be supplied into the vessel 110 through the second supply port 113.

The exhaust port 115 is used to discharge a fluid from inside the vessel 110, and may be formed in the lower vessel 110L. The exhaust port 115 may be connected to the exhaust unit 141 through an exhaust line 141L.

The substrate support 130 may support the substrate W provided in the processing space PS. The substrate support 130 may support the substrate W such that a first side of the substrate W faces the bottom wall of the vessel 110 and a second side of the substrate W opposite to the first side of the substrate W faces the upper wall of the vessel 110. In this case, the first side of the substrate W may be a pattern surface having a pattern formed therein. Alternatively, the second side of the substrate W may be a pattern surface having a pattern formed therein.

The substrate support 130 may support the edge of the substrate W. For example, the substrate support 130 may have a bent structure that extends vertically downward from the upper vessel 110U and extends in a horizontal direction again. The substrate support 130 may be installed in the fixed upper vessel 110U and stably support the substrate W while the lower vessel 110L is lifted.

The fluid supply 140 may supply a supercritical fluid into the vessel 110. The first supply line 140La for providing a supercritical fluid flow path may be connected to the first supply port 111 formed in the bottom wall of the vessel 110, and the fluid supply unit 140 may supply a supercritical fluid to the first side of the substrate W, supported by the substrate support 130, through the first supply line 140La and the first supply port 111. In addition, the second supply line 140Lb for providing a supercritical fluid flow path may be connected to the second supply port 113 formed in the upper wall of the vessel 110, and the fluid supply unit 140 may supply a supercritical fluid to the second side of the substrate W, supported by the substrate support 130, through the second supply line 140Lb and the second supply port 113.

The exhaust unit 141 may discharge a fluid inside the vessel 110. The exhaust line 141L for providing a flow path may be connected to the exhaust port 115, and the exhaust unit 141 may discharge the fluid inside the vessel 110 through the exhaust port 115 and the exhaust line 141L.

The barrier 150 may be provided in the vessel 110 to prevent particles in the vessel 110 from entering the substrate W supported by the substrate support 130. The barrier 150 may be arranged between the substrate support 130 and the side wall of the vessel 110 to prevent particles generated by the opening and closing of the vessel 110 from corrupting the substrate W.

For example, as shown in FIG. 1B, the barrier 150 may prevent particles, generated from a contact portion (refer to 119a and 119b in FIG. 5) where the upper vessel 110U and the lower vessel 110L contact each other, from being transferred to the substrate W when the vessel 110 is opened or closed. The barrier 150 may guide particles generated around the contact portion away from the substrate W to a lower portion of the vessel 110 where the exhaust port 115 is formed, and thus may prevent particles from corrupting the substrate W supported by the substrate support 130. In some embodiments of the inventive concept, the barrier 150 is configured to block a line of sight between the contact portion and the substrate support 130 and/or the substrate W when the vessel 110 is in the open or in the closed position. In further embodiments, of the inventive concept, the contact portion may include two opposing faces that are exposed when the vessel 110 is in the open position and are in contact to cover the contact portion when the vessel 110 is in the closed position.

The barrier 150 may be arranged on the upper wall of the vessel 110, for example, the lower surface of the upper vessel 110U, and may extend from the lower surface of the upper vessel 110U downward. For example, the barrier 150 may extend from the lower surface of the upper vessel 110U downward along the side wall of the vessel 110.

In some embodiments, the barrier 150 may extend downward from the lower surface of the upper vessel 110U to a point lower than the contact portion. In some embodiments, the barrier 150 may extend downward from the lower surface of the upper vessel 110U to a point lower than the substrate W supported by the substrate support 130.

In some embodiments, the barrier 150 may extend along the edge of the substrate W supported by the substrate support 130, and may have, for example, a ring shape. Alternatively, the barrier 150 may extend in a circumferential direction along the side wall of the vessel 110, and may have, for example, a ring shape.

The blocking plate 160 may block direct spray of a supercritical fluid supplied through the fluid supply unit 140 onto the substrate W. For example, the blocking plate 160 may be arranged between the first supply port 111 and the substrate support 130, and thus, a supercritical fluid sprayed from the first supply port 111 may be prevented from being directly sprayed onto the substrate W supported by the substrate support 130. For example, a supercritical fluid sprayed from the first supply port 111 and reaching the blocking plate 160 may move along the surface of the blocking plate 160 and then may reach the substrate W supported by the substrate support 130.

The blocking plate 160 may have a shape corresponding to the substrate W, and may have, for example, a disc shape. The blocking plate 160 may have a radius equal to or greater than the radius of the substrate W to effectively block the direct spray of a supercritical fluid onto the substrate W. Alternatively, the blocking plate 160 may have a smaller radius than the substrate W so that a supercritical fluid may relatively easily reach the substrate W.

In some embodiments, the blocking plate 160 may be arranged on the lower vessel 110L and may be spaced apart from the surface of the lower vessel 110L by a predetermined distance by a support 161. The first supply port 111 and/or the exhaust port 115 formed in the lower vessel 110L may vertically overlap the blocking plate 160. In this case, the blocking plate 160 may allow a supercritical fluid sprayed from the first supply port 111 to reach the substrate W, supported by the substrate support 130, with a predetermined stream along the surface of the blocking plate 160. The blocking plate 160 may also allow the fluid in the vessel 110 to exit through the exhaust port 115 with a predetermined, stream leading to the exhaust port 115 along the surface of the blocking plate 160.

The driving device 170 may adjust the switching between the closed position and the open position of the vessel 110. The driving device 170 may apply a driving force to the lift member 120 to drive the lift member 120 installed on the vessel 110. For example, the driving device 170 may be a hydraulic driving device and may include a control device such as a hydraulic pump for generating hydraulic pressure and a regulator. The driving device 170 may be connected to the lifting cylinder 121 through a hydraulic pressure transmission line 170L, and a hydraulic pressure regulating valve may be installed in the hydraulic pressure transmission line 170L.

Figure 2:
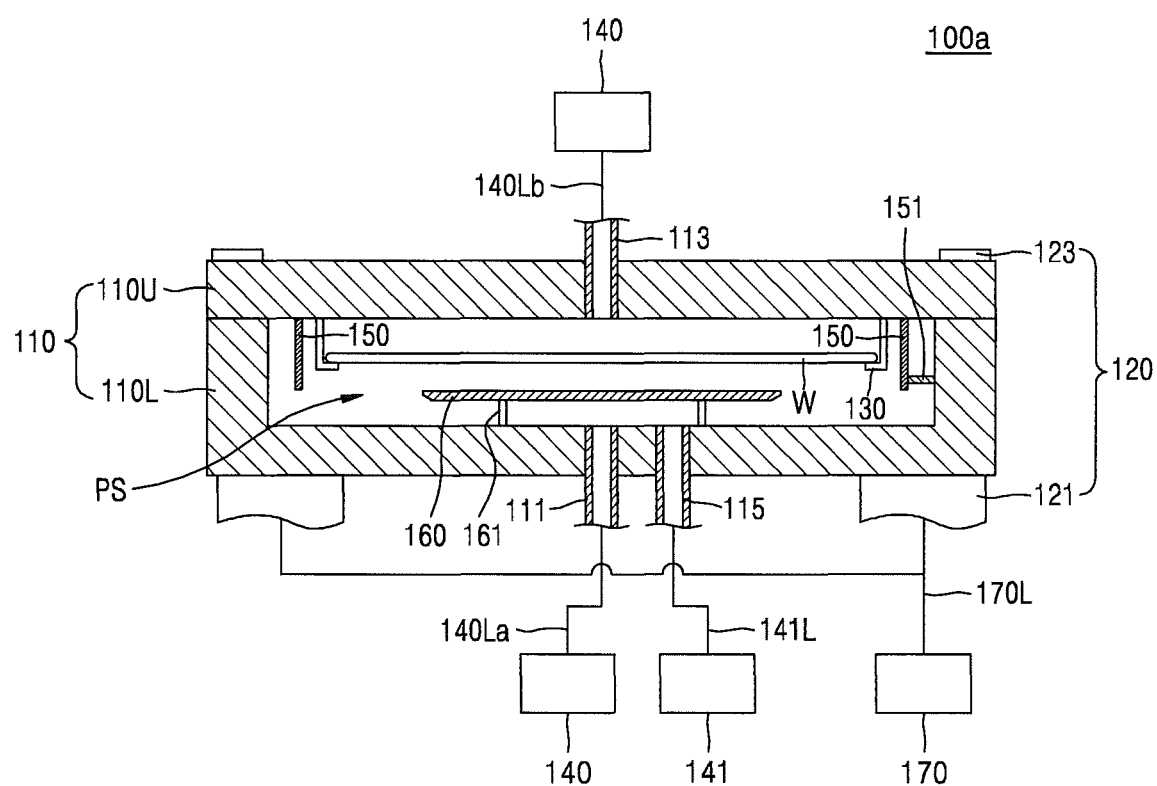
FIGS. 2 and 3 are cross-sectional views schematically showing substrate processing apparatuses according to embodiments.
Figure 3:
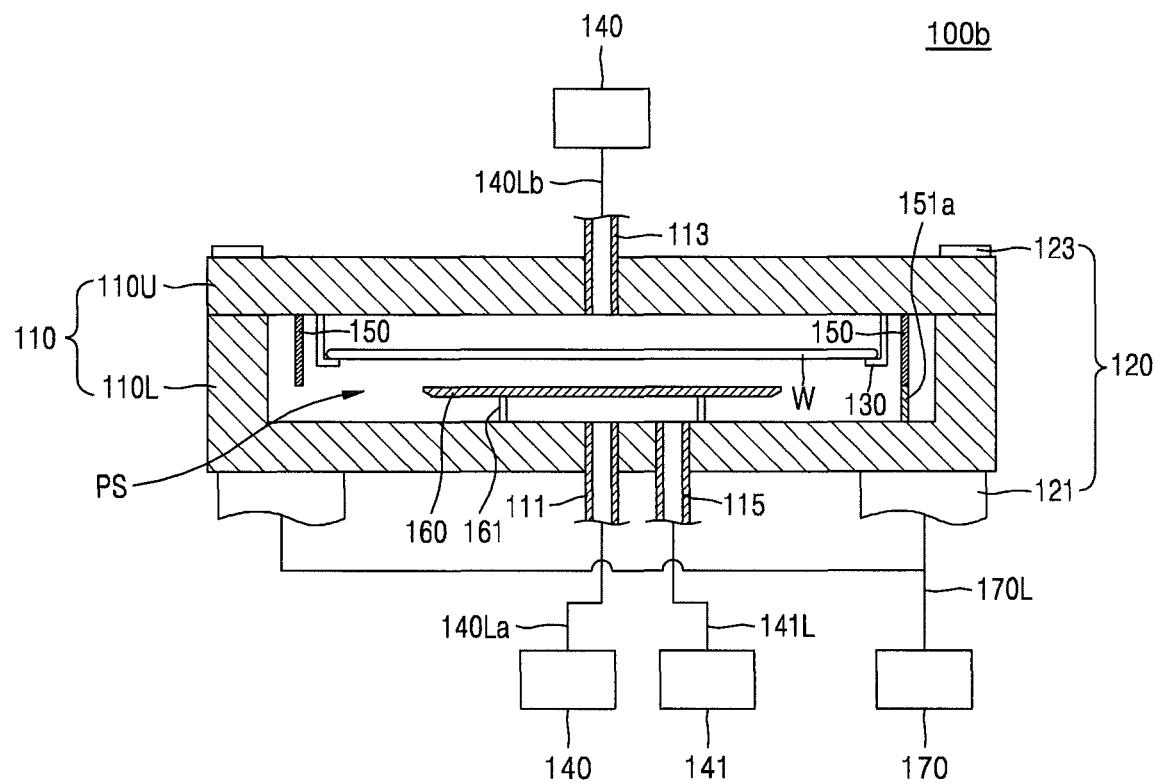

FIGS. 2 and 3 are cross-sectional views schematically showing substrate processing apparatuses 100a and 100b, respectively, according to embodiments. FIGS. 2 and 3 show the substrate processing apparatuses 100a and 100b in a closed position, and the substrate processing apparatuses 100a and 100b shown in FIGS. 2 and 3 may have substantially the same configuration as the substrate processing apparatus 100 shown in FIGS. 1A and 1B except that the substrate processing apparatuses 100a and 100b further include guide pins 151 and 151a, respectively.

Referring to FIGS. 2 and 3, the substrate processing apparatuses 100a and 100b may include a barrier 150 for preventing particles in a vessel 110 from entering a substrate W supported by a substrate support 130, and may further include the guide pins 151 and 151a, provided in the vessel 110, in contact with and to support the barrier 150.

The guide pins 151 and 151a may be in contact with and support the barrier 150 during a drying process for the substrate W. For example, when the vessel 110 is in a closed position to perform a drying process, the guide pins 151 and 151a may function to guide the barrier 150 to be positioned at a predetermined position. Also, the guide pins 151 and 151a may mitigate the vibration of the barrier 150 due to a pressure pulse or the like applied in the vessel 110 by contacting and supporting the barrier 150 during a drying process.

In some embodiments, the guide pin 151 may be in contact with and support the side of the barrier 150, as shown in FIG. 2. For example, the guide pin 151 may be arranged on a side wall of a lower vessel 110L.

In some embodiments, the guide pin 151a may be in contact with and support a lower portion of the barrier 150, as shown in FIG. 3. For example, the guide pin 151a may be arranged on a bottom wall of the vessel 110, e.g., a bottom wall of the lower vessel 110L.

Although FIGS. 2 and 3 show examples in which there is one guide pin 151 or 151a, the inventive concept is not limited thereto. In some embodiments, a plurality of guide pins 151 and 151a may be arranged along a circumferential direction of the barrier 150.

Figure 4:
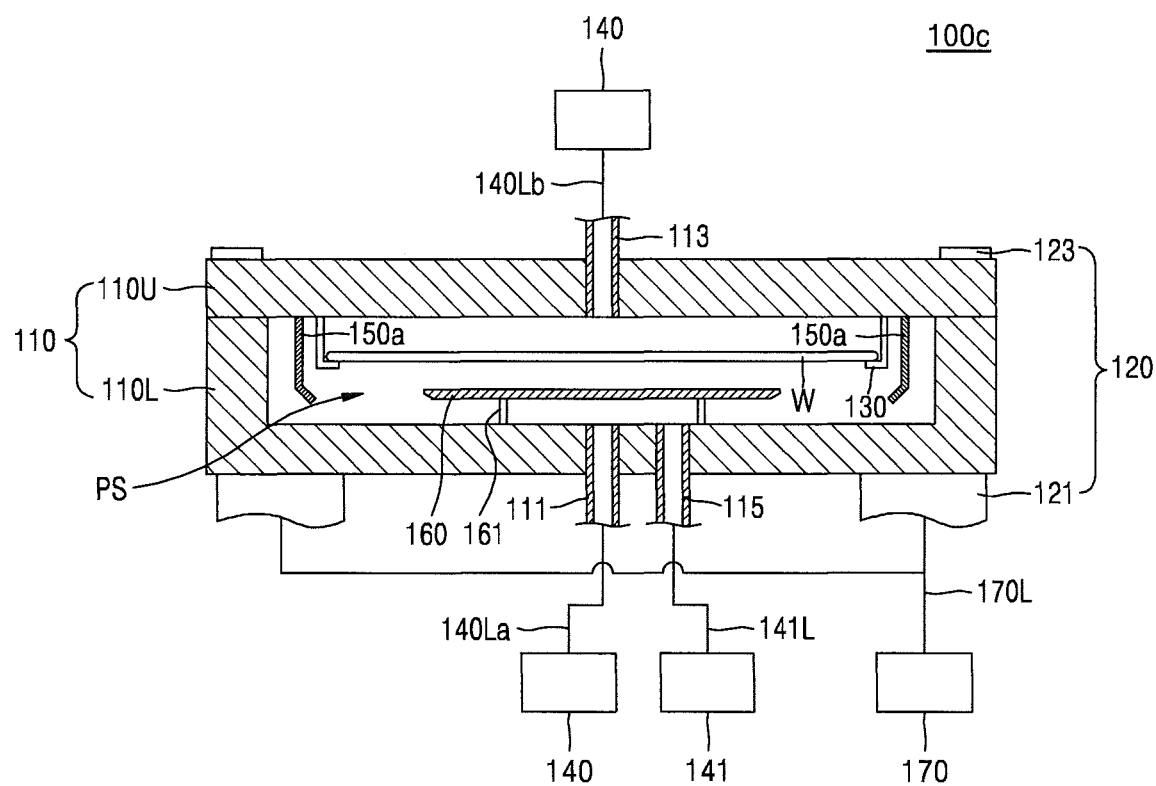
FIG. 4 is a cross-sectional view schematically showing a substrate processing apparatus according to embodiments.

FIG. 4 is a cross-sectional view schematically showing a substrate processing apparatus 100c according to embodiments. FIG. 4 shows the substrate processing apparatus 100c in a closed position, and the substrate processing apparatus 100c shown in FIG. 4 may have substantially the same configuration as the substrate processing apparatus 100 shown in FIGS. 1A and 1B except for the structure of a barrier 150a.

Referring to FIG. 4, the substrate processing apparatus 100c may include the barrier 150a for preventing particles in a vessel 110 from entering a substrate W supported by a substrate support 130, and the barrier 150a may have a shape in which a lower portion thereof is inwardly curved or bent away from the side wall of the lower vessel 110L.

Specifically, the barrier 150a may be coupled to an upper vessel 110U and extend downward from the upper vessel 110U toward the lower vessel 110L, and the lower portion of the barrier 150a may have an inwardly curved or bent shape. For example, in a ring-shaped barrier 150a, the lower portion of the barrier 150a may have a shape that gradually decreases downward.

With the above-described configuration, a distance between the barrier 150a and the side wall of the vessel 110 is increased near the lower portion of the barrier 150a, and thus, the pressure in the vicinity of the lower portion of the barrier 150a locally increases. Accordingly, particles generated in a contact portion (refer to 119a and 119b in FIG. 5) where the upper vessel 110U and the lower vessel 110L contact each other in a closed position may move downward more readily along the barrier 150a.

Figure 5:
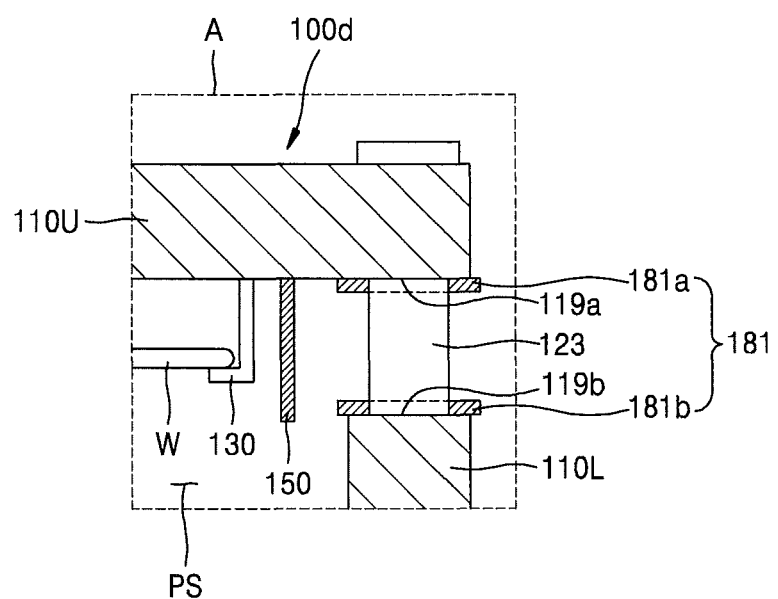
FIGS. 5 and 6 are cross-sectional views schematically showing substrate processing apparatuses according to embodiments, which show a portion corresponding to a region A in FIG. 1A.
Figure 6:
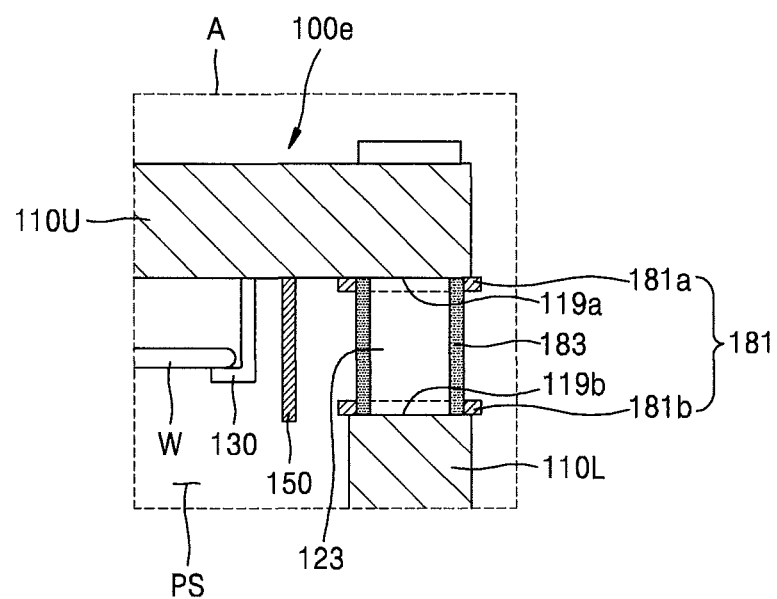

FIGS. 5 and 6 are cross-sectional views schematically showing substrate processing apparatuses 100d and 100e according to embodiments, which show a portion corresponding to a region A in FIG. 1A. The substrate processing apparatuses 100d and 100e shown in FIGS. 5 and 6 may have substantially the same configuration as the substrate processing apparatus 100 shown in FIGS. 1A and 1B except that the substrate processing apparatuses 100d and 100e further include a first protective layer 181 and/or a second protective layer 183.

Referring to FIG. 5, the substrate processing apparatus 100d may include the first protective layer 181 for preventing generation of particles due to friction between an upper vessel 110U and a lower vessel 110L.

The upper vessel 110U and the lower vessel 110L may be coupled to each other to be openable and closable to switch between a closed position for sealing a processing space PS and an open position for opening the processing space PS, and a vessel (refer to 110 in FIG. 1A) may have contact portions 119a and 119b where the upper vessel 110U and the lower vessel 110L contact in the closed position. That is, the contact portions 119a and 119b are regions where the upper vessel 110U and the lower vessel 110L contact each other in the closed position, and may denote a portion of the surface of the upper vessel 110U and a portion of the surface of the lower vessel 110L. The contact portions 119a and 119b are parts where repetitive friction occurs during a drying process, and abrasion may occur in the upper vessel 110U and the lower vessel 110L due to the friction at the contact portions 119a and 119b.

The first protective layer 181 may include an upper protective layer 181a formed on the contact portion 119a on a portion of the surface of the upper vessel 110U and a lower protective layer 181b formed on the contact portion 119b on a portion of the surface of the lower vessel 110L. In some embodiments, the first protective layer 181 may include at least one of the upper protective layer 181a and the lower protective layer 181b. For example, the first protective layer 181 may include only one of the upper protective layer 181a and the lower protective layer 181b.

The first protective layer 181 may reduce friction between the upper vessel 110U and the lower vessel 110L, caused by switching between the closed position and the open position, and may reduce generation of particles which may occur due to the friction. Particularly, the contact portions 119a and 119b are places where repetitive friction occurs when a pressure pulse is applied to the inside of the vessel 110 while a drying process is performed. The first protection layer 181 may prevent abrasion of the vessel 110 due to repetitive friction between the upper vessel 110U and the lower vessel 110L and may prevent generation of metallic particles due to the abrasion of the vessel 110.

The first protective layer 181 may include a material having low deformation at high pressure and having a low friction coefficient. In some embodiments, the first protective layer 181 may include a material having a friction coefficient less than about 0.5. Also, in some embodiments, the first protective layer 181 may include a resin-based material. For example, the first protective layer 181 may include polyimide (PI), polytetrafluoroethylene (PTFE), polychlorotrifluoroethyl (PCTFE), or a combination thereof.

In some embodiments, the first protective layer 181 may be formed on the contact portions 119a and 119b by a spray method. Alternatively, in other embodiments, the first protective layer 181 may be provided in a film shape and attached to the contact portions 119a and 119b. Furthermore, in order to form the first protective layer 181, an additional process for improving a contact force with the vessel 110 and/or an additional process for improving physical and chemical properties such as heat resistance, pressure resistance, and chemical resistance properties may be performed. In some embodiments, before the first protective layer 181 is formed on the contact portions 119a and 119b, electropolishing may be performed on the contact portions 119a and 119b to remove impurities on the surfaces of the contact portions 119a and 119b and flatten the surfaces of the contact portions 119a and 119b.

The first protective layer 181 may have a thickness in the range of several micrometers (µm) to several hundreds of millimetres (mm) on the contact portions 119a and 119b. For example, the first protective layer 181 may have a thickness between 1 µm and 10 µm, or may have a thickness between 10 mm and 100 mm.

In some embodiments, the first protective layer 181 may be formed on a portion of the surface of the upper vessel 110U and/or a portion of the surface of the lower vessel 110L, which constitute the contact portions 119a and 119b. As the first protective layer 181 is formed on the contact portions 119a and 119b where repetitive friction occurs, the number of particles generated due to the abrasion of the upper vessel 110U and the lower vessel 110L may be significantly reduced. Accordingly, defects occurring in the substrate W as a result of metallic particles being transferred and adsorbed onto the substrate W, supported by the substrate support 130, during a drying process may be reduced. Particularly, defects occurring in an edge portion of the substrate W may be reduced.

Referring to FIG. 6, the substrate processing apparatus 100e may further include the second protective layer 183 formed on a lifting rod 123 coupled to the upper vessel 110U and the lower vessel 110L to vertically guide the upper vessel 110U and/or the lower vessel 110L. The second protective layer 183 may include a material similar to the material of the first protective layer 181 and may be formed in a manner similar to that of the first protective layer 181.

Since the lifting rod 123 performs a function of guiding the movement of the upper vessel 110U and/or the lower vessel 110L, particles generated due to friction between the lifting rod 123 and the upper vessel 110U and/or the lower vessel 110L may readily flow into the vessel 110. In addition, particles generated from the contact portions 119a and 119b may be attached to the lifting rod 123, and particles attached to the lifting rod 123 may be detached due to repetitive friction and flow into the vessel 110.

As the second protective layer 183 is formed on the surface of the lifting rod 123, friction between the lifting rod 123 and the upper vessel 110U and/or the lower vessel 110L may be reduced and the number of particles generated due to the friction may be further reduced.

Figure 7:
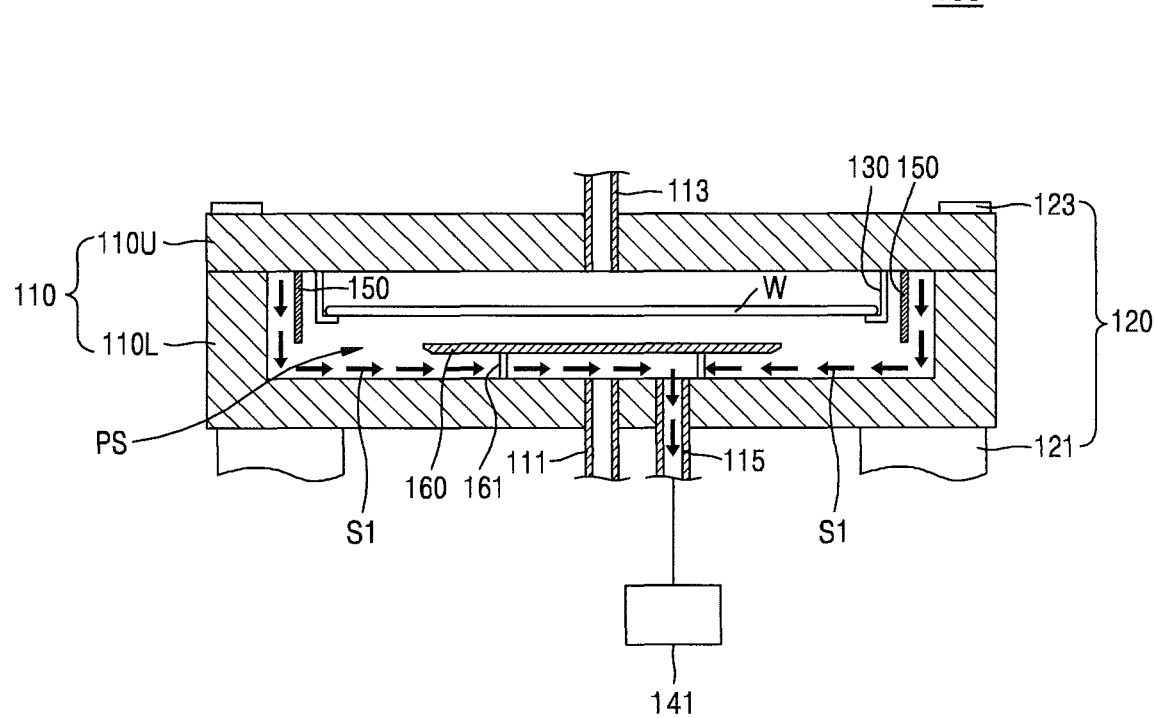
FIG. 7 is a diagram showing a stream along which a fluid is discharged from a vessel in a closed position in a substrate processing apparatus according to some embodiments.

FIG. 7 is a diagram showing a stream S1 along which a fluid is discharged from a vessel 110 in a closed position in a substrate processing apparatus 100 according to some embodiments.

Referring to FIG. 7, as described above, in the vicinity of contact portions (refer to 119a and 119b in FIG. 5) where an upper vessel 110U and a lower vessel 110L contact each other, particles may be generated due to abrasion of the upper vessel 110U and/or the lower vessel 110L. For example, the contact portions may be positioned near the edge of a lower surface of the upper vessel 110U, and may be positioned on a side wall of the vessel 110.

Since a barrier 150 is arranged between a substrate support 130 and a side wall of a vessel 110 and extends from the upper vessel 110U downward, a fluid containing particles generated near contact portions 119a and 119b may be guided by the barrier 150 and flow in a downward stream S1. That is, the particles generated near the contact portions 119a and 119b may move downward along the side walls of the barrier 150 and the vessel 110. Subsequently, a fluid containing the particles guided downward may be moved to the exhaust port 115 along the surface of the lower vessel 110L and be discharged from the exhaust port 115. In some embodiments, while the fluid containing the particles moves to the exhaust port 115, the fluid containing the particles may move to the exhaust port 115 along a path provided between the blocking plate 160 and the lower vessel 110L.

Figure 8:
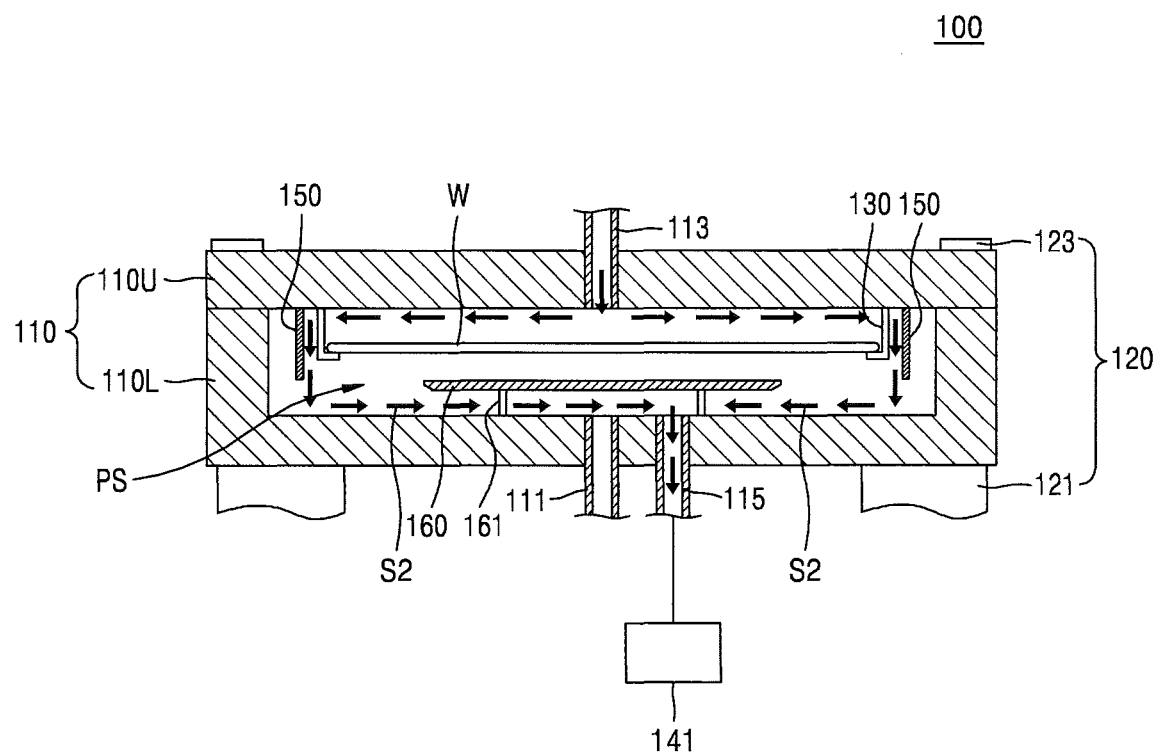
FIG. 8 is a diagram showing a stream of a supercritical fluid supplied into a vessel in a substrate processing apparatus according to some embodiments.

FIG. 8 is a diagram showing a stream S2 of a supercritical fluid supplied into a vessel 110 in a substrate processing apparatus 100 according to some embodiments.

Referring to FIG. 8, a barrier 150 may block the flow of a supercritical fluid that is supplied near contact portions (refer to 119a and 119b in FIG. 5), i.e., between the barrier 150 and a side wall of the vessel 110. For example, a supercritical fluid supplied through a second supply port 113 may have the stream S2 that flows in a radial direction of a substrate W along the substrate W supported by a substrate support 130, descends along the barrier 150 in the vicinity of the circumference of the substrate W, and then is discharged through the exhaust port 115. That is, the barrier 150 may block a supercritical fluid supplied through the second supply port 113 from flowing directly to the contact portions 119a and 119b, and may prevent an irregular flow of the supercritical fluid, for example, a turbulence flow of the supercritical fluid, in the vicinity of the contact portions 119a and 119b while the supercritical fluid flows directly to the vicinity of the contact portions 119a and 119b. Therefore, it is possible to prevent a phenomenon in which particles do not move to the exhaust port 115 due to the turbulence generated near the contact portions 119a and 119b and stay near the contact portions 119a and 119b.

Figure 9:
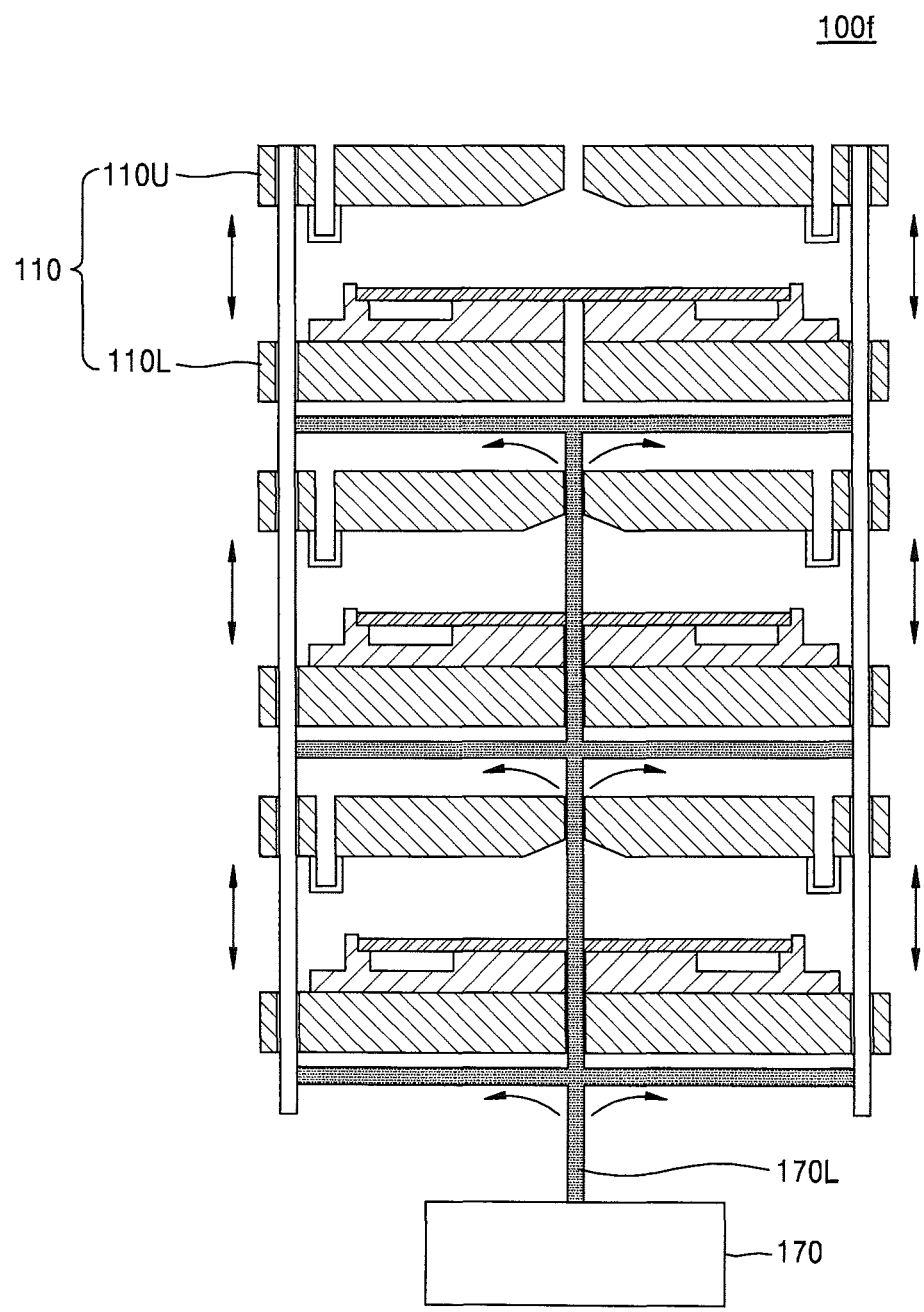
FIGS. 9 and 10 are views schematically showing substrate processing apparatuses according to some embodiments.
Figure 10:
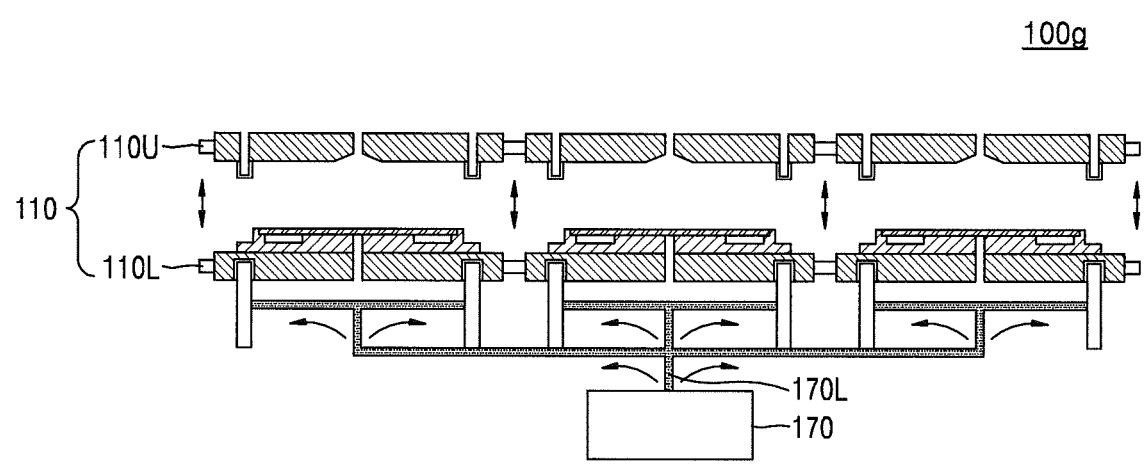

FIGS. 9 and 10 are views schematically showing substrate processing apparatuses 100f and 100g according to some embodiments, respectively. The substrate processing apparatuses 100f and 100g shown in FIGS. 9 and 10 may have substantially the same configuration as the substrate processing apparatuses 100, 100a, 100b, 100d, and 100e described above except that each of the substrate processing apparatuses 100f and 100g include a plurality of vessels 110.

Referring to FIGS. 9 and 10, each of the substrate processing apparatuses 100f and 100g may include the plurality of vessels 110, each of which provides a processing space in which a drying process for a substrate may be performed, and a driving device 170 coupled to each of the plurality of vessels 110. One driving device 170 may be provided, or the number thereof may be less than the number of the plurality of vessels 110. The driving device 170 may be positioned above, below, or beside the plurality of vessels 110.

In some embodiments, as shown in FIG. 9, the plurality of vessels 110 may be arranged in series, for example, in a form in which the vessels 110 are stacked. Switching between a closed position and an open position of each of the plurality of vessels 110 may be performed and/or controlled by one driving device 170. That is, the driving device 170 may apply a driving force, for example, a hydraulic pressure, for switching between the closed position and the open position to each of the plurality of vessels 110. In some embodiments, the driving device 170 may control the driving of the plurality of vessels 110 such that the switching between the closed position and the open position is performed simultaneously in each of the plurality of vessels 110, or may control the driving of the plurality of vessels 110 such that the switching between the closed position and the open position is performed separately in each of the plurality of vessels 110.

In some embodiments, as shown in FIG. 10, the substrate processing apparatus 100g may include a plurality of vessels 110 arranged in parallel and a driving device 170 connected to each of the plurality of vessels 110. For example, the plurality of vessels 110 may be arranged side-by-side.

Since each of the substrate processing apparatuses 100f and 100g includes a plurality of vessels 110 that are driven by one driving device 170, more vessels 110 per area may be used for a drying process, and thus, process productivity may be further improved. For example, a unit per equipment hour (UPEH) may be further improved.

Figure 11:
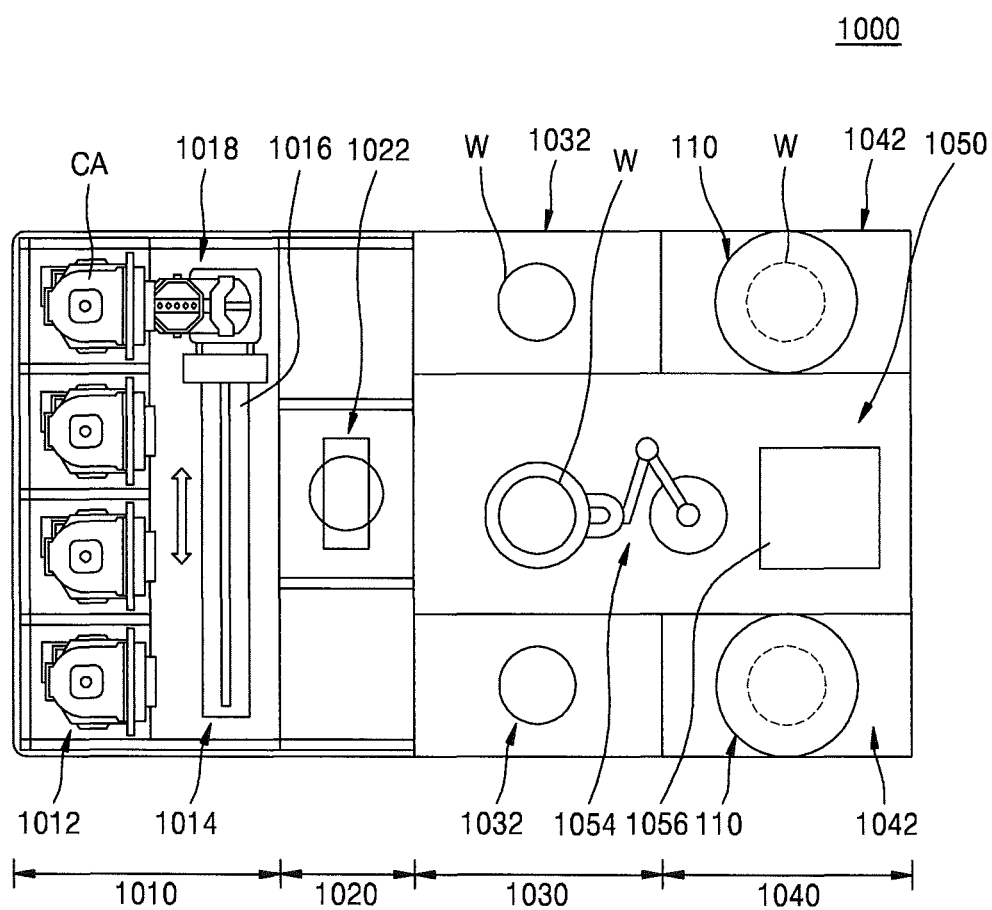
FIG. 11 is a plan view schematically showing an integrated circuit device manufacturing apparatus according to some embodiments.

FIG. 11 is a plan view schematically showing an integrated circuit device manufacturing apparatus 1000 according to some embodiments. In FIG. 11, the same reference numerals as those in FIGS. 1A and 1B denote the same elements as those in FIGS. 1A and 1B, and detailed descriptions thereof will be omitted.

Referring to FIG. 11, the integrated circuit device manufacturing apparatus 1000 includes an index module 1010, a buffer unit 1020, a cleaning unit 1030, a drying unit 1040, and a conveying unit 1050.

The index module 1010 includes a load port 1012 and a transfer frame 1014.

A carrier CA accommodating a substrate W is placed in the load port 1012. The index module 1010 may include a plurality of load ports 1012, but is not limited thereto. The number of load ports 1012 may be variously determined according to the process efficiency and the process control condition of the integrated circuit device manufacturing apparatus 1000. For example, a front opening unified pod (FOUP) may be used as the carrier CA.

An index rail 1016 and an index robot 1018 may be provided in the transfer frame 1014. The transfer frame 1014 may convey the substrate W between the carrier CA placed on the load port 1012 and the conveying unit 1050.

In some embodiments, the substrate W may be a wafer, for example, a silicon wafer. In some other embodiments, the substrate W may be a glass substrate W. Patterns having a large aspect ratio may be formed on the substrate W.

The buffer unit 1020 may be arranged between the transfer frame 1014 and the conveying unit 1050. The buffer unit 1020 provides a space in which the substrate W stays before the substrate W is conveyed between the conveying unit 1050 and the transfer frame 1014. A surface of the buffer unit 1020, which faces the transfer frame 1014, and a surface of the buffer unit 1020, which faces the conveying unit 1050, may be opened.

The cleaning unit 1030 may be configured to supply a treatment liquid to the substrate W to perform a predetermined wet cleaning.

The cleaning unit 1030 includes at least one wet treatment apparatus 1032 for supplying a treatment liquid to the substrate W to perform a wet processing. Although FIG. 11 illustrates a case where two wet treatment apparatuses 1032 are included in the cleaning unit 1030, but the inventive concept is not limited thereto.

In the cleaning unit 1030, a wet cleaning may be performed by supplying a treatment liquid to the substrate W. After the cleaning treatment of the substrate W, a rinsing treatment may be performed with a rinsing liquid, for example, deionized water or isopropyl alcohol. When isopropyl alcohol is used as the rinsing liquid, reactivity with a supercritical fluid used in a subsequent drying treatment, for example, supercritical carbon dioxide, is high and thus, the isopropyl alcohol may be easily removed.

In addition, after the rinsing treatment, an additional wetting treatment may be performed using a wetting liquid containing an organic solvent having a higher affinity for carbon dioxide than deionized water, in order to promote a subsequent drying treatment using a supercritical fluid. When a surfactant is added to a rinsing liquid, vapor pressure is lowered because the interaction between a liquid phase and a gaseous phase is weakened. Therefore, when the substrate W is conveyed from the cleaning unit 1030 to the drying unit 1040 in a state where a wetting liquid containing a surfactant is present on the substrate W, a natural drying of the substrate W may be suppressed. As the surfactant, a material which may be dissolved well in a wetting liquid and may be dissolved well in a supercritical fluid such as supercritical carbon dioxide may be used. The surfactant may include at least one of a trimethyl nonanol (TMN) surfactant, a fluorinated surfactant having a branch, and a surfactant including a fluorinated block copolymer.

The conveying unit 1050 may take out the substrate W cleaned by the cleaning unit 1030, supply an anti-drying liquid to the cleaned substrate W, and convey the substrate W in a wet state to the drying unit 1040. The conveying unit 1050 may include a conveying member 1054 for supporting the substrate W and a wet conveying unit 1056 for supplying an anti-drying liquid to the substrate W. The conveying member 1054 may take out the substrate W from the cleaning unit 1030 and convey the substrate W, taken out from the cleaning unit 1030, to the drying unit 1040.

In the conveying unit 1050, the wet conveying unit 1056 may spray, on the substrate W, a wetting liquid for preventing drying. Isopropyl alcohol may be used as the wetting liquid for preventing drying, but is not limited thereto. It is possible to prevent the natural drying of a rinsing liquid on the substrate W by supplying a wetting liquid for preventing drying to the substrate W after the cleaning and rinsing process of the substrate W.

In this way, since the natural drying of a rinsing liquid on the substrate W is prevented by supplying a wetting liquid for preventing drying to the substrate W when the substrate W is conveyed from the cleaning unit 1030 to the drying unit 1040, a leaning phenomenon, in which patterns formed on the substrate W are inclined due to surface tension between gas and liquid even if the aspect ratio of the patterns is relatively large when the substrate W is dried in the drying unit 1040, may be suppressed. In addition, when a substrate W with patterns having a relatively large aspect ratio is wet-cleaned and then is dried using a supercritical fluid in a state in which a natural drying is suppressed, the generation of a water spot on the substrate W may be suppressed.

The drying unit 1040 may dry the substrate W that has undergone cleaning and rinsing processes in the cleaning unit 1030. The drying unit 1040 is configured to dry the substrate W by using a supercritical fluid. In the drying unit 1040, the substrate W is dried using the low viscosity and surface tension of the supercritical fluid. The drying unit 1040 may be arranged separately from the cleaning unit 1030.

The drying unit 1040 includes at least one drying chamber 1042 for drying the substrate W. FIG. 11 illustrates that two drying chambers 1042 are included in the drying unit 1040. However, the inventive concept is not limited thereto, and the number of drying chambers 1042 may be determined as necessary. The drying chamber 1042 may be configured with any one of the substrate processing apparatuses 100, 100a, 100b, 100d, 100e, 100f, and 100g described with reference to FIGS. 1A to 6, 9, and 10, or with a substrate processing apparatus having a structure modified and changed according to the scope of the inventive concept from the substrate processing apparatuses 100, 100a, 100b, 100d, 100e, 100f, and 100g.

Figure 12:
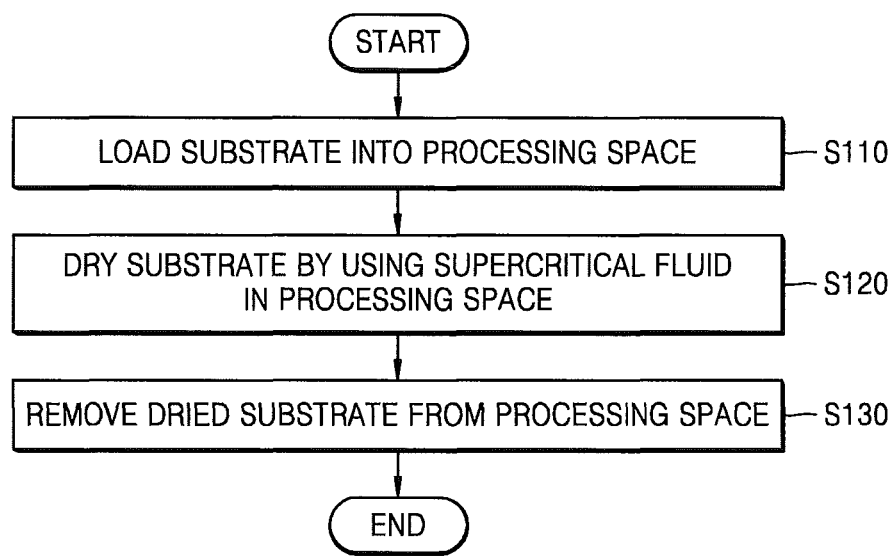
FIG. 12 is a flowchart for explaining a substrate processing method according to embodiments.
Figure 13:
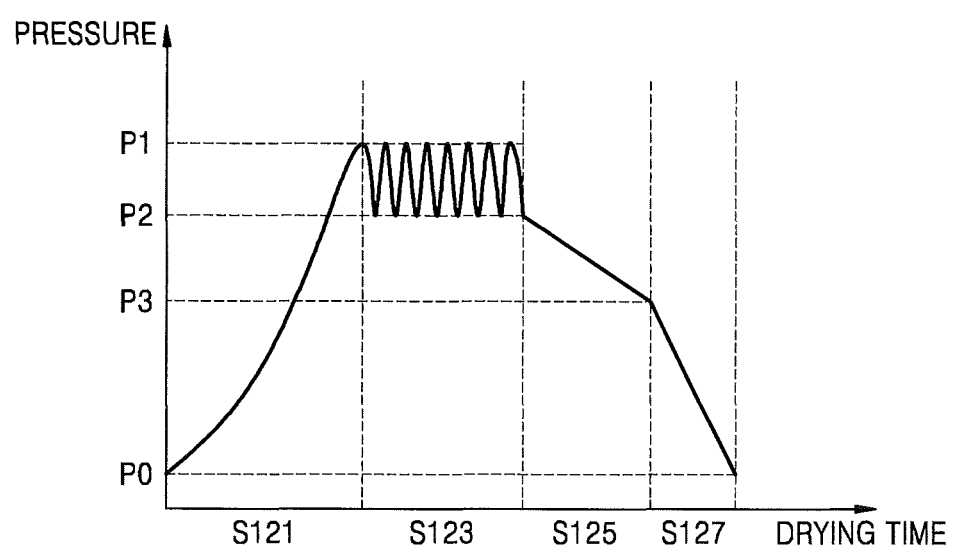
FIG. 13 is a graph showing an example of pressure change in a processing space of a vessel in an operation of drying a substrate of FIG. 12.

FIG. 12 is a flowchart for explaining a substrate processing method according to embodiments. FIG. 13 is a graph showing an exemplary pressure change in a processing space PS of a vessel 110 in an operation of drying a substrate of FIG. 12.

Referring to FIGS. 12 and 13 together with FIGS. 1A and 1B, the substrate W is loaded into the processing space PS of the vessel 110 (Operation S110). The vessel 110 may be placed in an open position while the substrate W is being loaded into the processing space PS, and the substrate W may be supported by the substrate support 130 in the processing space PS.

Subsequently, the substrate W is dried using a supercritical fluid in the processing space PS of the vessel 110 (Operation S120). During a drying process for the substrate W, the vessel 110 may be placed in a closed position to seal the processing space PS. The sealed state of the processing space PS may be maintained by the lift member 120 and the driving device 170.

After the substrate W is loaded into the processing space PS of the vessel 110 to dry the substrate W, the pressure in the processing space PS may be increased from an initial pressure P0, which is similar to atmospheric pressure, to a first pressure P1 by making a fluid such as carbon dioxide to flow into the processing space PS of the vessel 110 through the first supply port 111, at the closed position of the vessel 110 as illustrated in FIG. 1B (Operation S121). A fluid may be supplied into the processing space PS of the vessel 110 through the first supply port 111 until a fluid in the processing space PS of the vessel 110 reaches a saturated vapor pressure or a critical pressure. After the fluid in the processing space PS of the vessel 110 reaches the saturation vapor pressure, the temperature in the processing space PS of the vessel 110 may be raised to a temperature equal to or greater than a critical temperature of the fluid in the processing space PS. When the temperature in the processing space PS of the vessel 110 reaches a critical temperature of the supplied fluid, the fluid in the processing space PS of the vessel 110 may be in a supercritical state.

Thereafter, during a drying process for the substrate W using a supercritical fluid in the processing space PS, a depressurization process and a pressure boosting process may be alternately repeated at least twice to apply a pressure pulse to the wafer W (Operation S123). The depressurization process is a process of adjusting the supply flow rate of the supercritical fluid supplied in the processing space PS so that the pressure in the processing space PS is reduced from the first pressure P1 to a second pressure P2 lower than the first pressure P1. The pressure boosting process is a process of boosting the pressure in the processing space PS from the second pressure P2 to the first pressure P1 again.

In some embodiments, the first pressure P1 may be about 140 bar and the second pressure P2 may be about 100 bar. However, the inventive concept is not limited thereto.

In order to alternately repeat the depressurization process and the pressure boosting process between the first pressure P1 and the second pressure P2, as in Operation S123, a process of supplying a predetermined amount of pressure control fluid into the processing space PS of the vessel 110 through the second supply port 113 as illustrated in FIG. 1A and a process of discharging gas in the processing space PS of the vessel 110 through the exhaust port 115 may be alternately repeated.

After the drying process for the substrate W loaded in the processing space PS of the vessel 110 is completed, a low-speed exhaust process (Operation S125) of lowering the pressure in the processing space PS of the vessel 110 to a third pressure P3, and a high-speed exhaust process (Operation S127) of lowering the pressure in the processing space PS of the vessel 110 to an initial pressure P0 similar to the atmospheric pressure may be sequentially performed. The low-speed exhaust process (Operation S125) and the high-speed exhaust process (Operation S127) may be controlled by controlling an exhaust flow rate through the exhaust port 115.

Next, when the drying process for the substrate W is completed, the dried substrate W is removed from the processing space PS (Operation S130). In order to remove the substrate W from the processing space PS, the vessel 110 may be switched from the closed position to the open position.

According to the substrate processing method according to the embodiments, since the substrate processing apparatus 100 includes the barrier 150, the substrate processing apparatus 100 may prevent particles generated due to the friction between the upper vessel 110U and the lower vessel 110L from flowing into the substrate W during a drying process using a supercritical fluid, and may effectively discharge the particles to the exhaust port 115. In addition, since a protective layer (refer to 181 in FIG. 5) is formed on contact portions (refer to 119a and 119b in FIG. 5) of the upper vessel 110U and the lower vessel 110L, the generation of particles due to abrasion of the upper vessel 110U and the lower vessel 110L may be suppressed while a pressure pulse is applied to the inside of the vessel 110 as in Operation S123.

According to the substrate processing method according to the embodiments, a drying process may be performed in each of the plurality of vessels 110 and the switching between a closed position and an open position of each of the plurality of vessels 110 may be controlled by one driving device 190, and thus, the productivity of the drying process may be improved.

While the inventive concept has been particularly shown and described with reference to embodiments thereof, it will be understood that various changes in form and details may be made therein without departing from the spirit and scope of the following claims.

What is claimed is:

1. A substrate processing apparatus comprising:
a vessel comprising a processing space for processing a substrate, and an upper vessel and a lower vessel detachably coupled to each other,
wherein a first inner surface of the upper vessel and a second inner surface of the lower vessel are configured to define the processing space, and wherein the vessel further comprises:
a first supply port in the upper vessel configured to supply a first supercritical fluid into the vessel; and
an exhaust port in the lower vessel configured to discharge a fluid from inside the vessel;
a substrate support configured to support the substrate loaded in the processing space; and
a barrier, between a side wall of the vessel and the substrate support, configured to surround the substrate support,
wherein an upper end of the barrier is directly connected to the first inner surface of the upper vessel and is closed by the first inner surface of the upper vessel, a side wall of the barrier surrounds the substrate and the substrate support, and a lower end of the barrier is open, and
wherein the barrier extends downward from the upper vessel to a point lower than the substrate supported by the substrate support and is configured to:
block the first supercritical fluid supplied from the first supply port from flowing directly to a contact portion between the upper vessel and the lower vessel to the point lower than the substrate supported by the substrate support, and cause the first supercritical fluid to flow downwardly toward a bottom portion of the second inner surface of the lower vessel; and
guide fluid flowing from the contact portion between the upper vessel and the lower vessel downward to the point lower than the substrate supported by the substrate support and cause the guided fluid to flow downwardly toward the bottom portion of the second inner surface of the lower vessel.

2. The substrate processing apparatus of claim 1, further comprising:
a first guide pin connected to a side wall of the lower vessel,
wherein the first guide pin is configured to guide the barrier to be positioned in at a predetermined position in the processing space such that the first guide pin is in contact with the barrier without fixation thereto.

3. The substrate processing apparatus of claim 1, wherein the barrier has a ring shape and extends in a direction of an edge of the substrate supported by the substrate support.

4. The substrate processing apparatus of claim 1, wherein the upper vessel and the lower vessel detachably coupled to each other are openable and closable to switch between a closed position for sealing the processing space and an open position for opening the processing space.

5. The substrate processing apparatus of claim 4, wherein the contact portion between the upper vessel and the lower vessel is where the upper vessel and the lower vessel contact each other in the closed position, and the substrate processing apparatus further comprises a first protective layer on the contact portion,
wherein the first protective layer is disposed between a bottom surface of the upper vessel and a top surface of the lower vessel in the closed position,
wherein the top surface of the lower vessel is flat,
wherein the first protective layer contacts a portion of the bottom surface of the upper vessel and a portion of the top surface of the lower vessel in the closed position, and
wherein the portion of the bottom surface of the upper vessel and the portion of the top surface of the lower vessel constitute the contact portion.

6. The substrate processing apparatus of claim 4, wherein the vessel comprises a lifting rod coupled to the upper vessel and the lower vessel to guide at least one of the upper vessel and the lower vessel between the closed position and the open position, and the substrate processing apparatus further comprises a second protective layer on the lifting rod.

7. The substrate processing apparatus of claim 4, wherein the vessel further comprises:
a second supply port in the lower vessel to supply a second supercritical fluid into the vessel.

8. The substrate processing apparatus of claim 1, wherein a lower portion of the barrier is shaped so as to be bent inward away from the side wall of the vessel.

9. The substrate processing apparatus of claim 1, wherein the substrate support and the barrier are fixed to the bottom surface of the upper vessel.

10. A substrate processing apparatus comprising:
at least one vessel comprising a processing space configured to process a substrate, wherein the at least one vessel comprises an upper vessel and a lower vessel moveably coupled to each other so as to be openable and closable to switch between a closed position for sealing the processing space and an open position for opening the processing space;
a substrate support configured to support the substrate loaded in the processing space, wherein the substrate support is coupled to an upper wall of the at least one vessel;
a barrier between a side wall of the at least one vessel and the substrate support, wherein an upper end of the barrier is directly connected to the upper wall defining the processing space of the at least one vessel, a side wall of the barrier surrounds the substrate and the substrate support, and a lower end of the barrier is open; and
a first supply port in the upper wall of the at least one vessel and configured to supply a first supercritical fluid into the processing space; and
an exhaust port in a bottom wall of the at least one vessel opposite the upper wall and configured to discharge a fluid from inside the at least one vessel,
wherein the barrier extends downward along a direction of the side wall of the at least one vessel toward the bottom wall,
wherein a lowest portion of the barrier extends from the upper wall past a lowest portion of the substrate support when the vessel is in the closed position, and
wherein the barrier is configured to:
block the first supercritical fluid supplied from the first supply port from flowing directly to a contact portion between the upper vessel and the lower vessel to a point lower than the lowest portion of the barrier, and cause the first supercritical fluid to flow downwardly toward the bottom wall of the at least one vessel; and guide fluid flowing from the contact portion between the upper vessel and the lower vessel downward to the point lower than the lowest portion of the barrier and cause the guided fluid to flow downwardly toward the bottom wall of the at least one vessel.

11. The substrate processing apparatus of claim 10, wherein the at least one vessel comprises:
a lifting rod connecting the upper vessel to the lower vessel, the lifting rod configured to guide movement of the lower vessel; and
a lifting cylinder coupled to the lower vessel, the lifting cylinder configured to move the lower vessel, and
wherein the substrate processing apparatus further comprises a driving device comprising a hydraulic pump configured to generate hydraulic pressure and a transmission line connecting the hydraulic pump to the lifting cylinder.

12. The substrate processing apparatus of claim 11, wherein the at least one vessel comprises a plurality of vessels arranged in parallel, and wherein the hydraulic pump is connected to each of the plurality of vessels through the transmission line.

13. The substrate processing apparatus of claim 11, wherein the at least one vessel comprises a plurality of vessels stacked together, and wherein the hydraulic pump is connected to each of the plurality of vessels through the transmission line.

14. The substrate processing apparatus of claim 10, further comprising:
a first guide pin connected to a side wall of the lower vessel, wherein the first guide pin is configured to guide the barrier to be positioned in at a predetermined position in the processing space such that the first guide pin is in contact with the barrier without fixation thereto.

15. The substrate processing apparatus of claim 10, wherein the at least one vessel comprises:
a contact portion where the upper vessel and the lower vessel contact each other in the closed position; and
a lifting rod coupled to the upper vessel and the lower vessel to guide at least one of the upper vessel and the lower vessel between the closed position and the open position, and
wherein the substrate processing apparatus further comprises a first protective layer on the contact portion and a second protective layer on the lifting rod.

16. An apparatus for manufacturing an integrated circuit device, the apparatus comprising:
a drying chamber for drying a substrate comprising:
a vessel comprising a processing space configured to process the substrate, wherein the vessel comprises an upper vessel and a lower vessel coupled to each other so as to be openable and closable to switch between a closed position to seal the processing space and an open position to open the processing space
wherein a first inner surface of the upper vessel and a second inner surface of the lower vessel are configured to define the processing space, and
wherein the vessel further comprises:
a first supply port in the upper vessel configured to supply a first supercritical fluid into the vessel; and
an exhaust port in the lower vessel configured to discharge a fluid from inside the vessel;
a substrate support configured to support the substrate loaded in the processing space, wherein the substrate support is coupled to the upper vessel; and
a barrier coupled to the upper vessel to surround an edge of the substrate supported by the substrate support, wherein an upper end of the barrier is directly connected to the first inner surface of the upper vessel and is closed by the first inner surface of the upper vessel, a side wall of the barrier surrounds the substrate and the substrate support, and a lower end of the barrier is open,
wherein the barrier extends downward from the upper vessel to a point lower than the substrate supported by the substrate support and is configured to:
block the first supercritical fluid supplied from the first supply port from flowing directly to a contact portion between the upper vessel and the lower vessel to the point lower than the substrate supported by the substrate support, and cause the first supercritical fluid to flow downwardly toward a bottom portion of the second inner surface of the lower vessel; and
guide fluid flowing from the contact portion between the upper vessel and the lower vessel downward to the point lower than the substrate supported by the substrate support and cause the guided fluid to flow downwardly toward the bottom portion of the second inner surface of the lower vessel.

17. The apparatus of claim 16,
wherein the vessel comprises a contact portion where the upper vessel and the lower vessel contact each other in the closed position,
wherein the apparatus further comprises a protective layer disposed between a portion of a bottom surface of the upper vessel and a portion of a top surface of the lower vessel,
wherein the top surface of the lower vessel is flat,
wherein the protective layer contacts the portion of the bottom surface of the upper vessel and the portion of the top surface of the lower vessel in the closed position, and
wherein the portion of the bottom surface of the upper vessel and the portion of the top surface of the lower vessel constitute the contact portion.

* * * * *